United States Patent
Kitajima et al.

(10) Patent No.: US 9,811,077 B2
(45) Date of Patent: *Nov. 7, 2017

(54) POLISHING WITH PRE DEPOSITION SPECTRUM

(71) Applicant: Applied Materials, Inc., Santa Clara, CA (US)

(72) Inventors: Tomohiko Kitajima, San Jose, CA (US); Jeffrey Drue David, San Jose, CA (US); Jun Qian, Sunnyvale, CA (US); Taketo Sekine, Cupertino, CA (US); Garlen C. Leung, San Jose, CA (US); Sidney P. Huey, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 432 days.

This patent is subject to a terminal disclaimer.

(21) Appl. No.: 14/333,395

(22) Filed: Jul. 16, 2014

(65) Prior Publication Data

US 2016/0018815 A1  Jan. 21, 2016

(51) Int. Cl.
*G06F 19/00* (2011.01)
*G05B 19/418* (2006.01)

(52) U.S. Cl.
CPC .. *G05B 19/418* (2013.01); *G05B 2219/45031* (2013.01); *G05B 2219/45232* (2013.01); *Y02P 90/02* (2015.11)

(58) Field of Classification Search
CPC combination set(s) only.
See application file for complete search history.

(56) References Cited

U.S. PATENT DOCUMENTS

| | | |
|---|---|---|
| 6,213,844 B1 | 4/2001 | Lenkersdorfer |
| 6,271,047 B1 | 8/2001 | Ushio et al. |
| 6,407,546 B1 | 6/2002 | Le et al. |
| 6,593,238 B1 | 7/2003 | Haggart et al. |
| 6,707,540 B1 | 3/2004 | Lehman et al. |

(Continued)

FOREIGN PATENT DOCUMENTS

KR  10-2004-0014423  2/2004

OTHER PUBLICATIONS

International Search Report and Written Opinion in International Application No. PCT/US2015/039780, dated Sep. 30, 2015, 7 pages.

*Primary Examiner* — Kidest Bahta
(74) *Attorney, Agent, or Firm* — Fish & Richardson P.C.

(57) ABSTRACT

A method of controlling polishing includes storing a base spectrum, the base spectrum being a spectrum of light reflected from a substrate after deposition of a deposited dielectric layers overlying a metallic layer or semiconductor wafer and before deposition of a non-metallic layer over the plurality of deposited dielectric layer. After deposition of the non-metallic layer and during polishing of the non-metallic layer on the substrate, measurements of a sequence of raw spectra of light reflected the substrate during polishing are received from an in-situ optical monitoring system. Each raw spectrum is normalized to generate a sequence of normalized spectra using the raw spectrum and the base spectrum. At least one of a polishing endpoint or an adjustment for a polishing rate is determined based on at least one normalized predetermined spectrum from the sequence of normalized spectra.

19 Claims, 8 Drawing Sheets

(56) References Cited

U.S. PATENT DOCUMENTS

| | | |
|---|---|---|
| 6,924,641 B1 | 8/2005 | Hanawa et al. |
| 7,008,296 B2 | 3/2006 | Swedek et al. |
| 7,016,795 B2 | 3/2006 | Swedek et al. |
| 7,764,377 B2 | 7/2010 | Benvegnu et al. |
| 8,747,189 B2 | 6/2014 | David |
| 9,186,774 B2 | 11/2015 | Swedek et al. |
| 9,362,186 B2 | 6/2016 | Kitajima et al. |
| 2001/0036738 A1 | 11/2001 | Hatanaka et al. |
| 2003/0087459 A1 | 5/2003 | Laursen et al. |
| 2004/0058543 A1 | 3/2004 | Bothra et al. |
| 2004/0448480 | 3/2004 | Ting et al. |
| 2007/0145236 A1* | 6/2007 | Kiesel ............... G01J 1/4228 250/208.1 |
| 2012/0274932 A1* | 11/2012 | David ............... B24B 37/013 356/300 |
| 2012/0276661 A1 | 11/2012 | Iravani et al. |
| 2016/0284615 A1 | 9/2016 | Kitajima et al. |

\* cited by examiner

POLISHING WITH PRE DEPOSITION SPECTRUM

TECHNICAL FIELD

The present disclosure relates to polishing control methods, e.g., during chemical mechanical polishing of substrates.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. An oxide filler layer, for example, can be deposited on a patterned insulative layer to fill the trenches or holes in the insulative layer. After planarization, filler layer is planarized until a predetermined thickness is left over the non planar surface or the top surface of the underlying layer is exposed. For other applications, the filler layer is planarized until a predetermined thickness remains over the patterned underlying layer. In addition, planarization of the substrate surface is usually required for photolithography.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing liquid, such as a slurry with abrasive particles, is typically supplied to the surface of the polishing pad.

One problem in CMP is determining whether the polishing process is complete, e.g., whether a substrate layer has been planarized to a desired flatness or thickness, or when a desired amount of material has been removed. Variations in the initial thickness of the substrate layer, the slurry composition, the polishing pad condition, the relative speed between the polishing pad and the substrate, the thicknesses of each deposited layer, and the load on the substrate can cause variations in the material removal rate. These variations cause variations in the time needed to reach the polishing endpoint. Therefore, it may not be possible to determine the polishing endpoint merely as a function of polishing time.

In some systems, a substrate is optically monitored in-situ during polishing, e.g., through a window in the polishing pad. However, existing optical monitoring techniques may not satisfy increasing demands of semiconductor device manufacturers.

SUMMARY

In some optical monitoring processes, a spectrum measured in-situ, e.g., during a polishing process of CMP, is compared to a library of reference spectra to find the best matching reference spectrum. The spectrum measured in-situ can contain multiple noise components that can distort the results, rendering inaccurate comparison to the library of reference spectra. One prominent noise component is underlayer variation. That is, due to process variations, the various material layers below the layer being polished can vary from substrate-to-substrate in indices of refraction and thicknesses.

A normalization method that may address these problems includes measuring a base spectrum of a substrate after deposition of one or more dielectric layers, but prior to deposition of the outer layer(s) to be polished. The measured base spectrum is used to normalize each measured spectra obtained during polishing, which can then be compared with a library of reference spectra to find the best matching reference spectrum.

In one aspect a computer program product, tangibly embodied in a machine readable storage device, includes instructions to carry out a method of controlling polishing. The method including storing a base spectrum, the base spectrum being a spectrum of light reflected from a substrate after deposition of a plurality of deposited dielectric layers overlying a metallic layer or semiconductor wafer and before deposition of a non-metallic layer over the plurality of deposited dielectric layer. After deposition of the non-metallic layer over the plurality of deposited dielectric layer and during polishing of the non-metallic layer on the substrate, measurements of a sequence of raw spectra of light reflected from the substrate during polishing are received from an in-situ optical monitoring system. Each raw spectrum in the sequence of raw spectra is normalized to generate a sequence of normalized spectra using the raw spectrum and the base spectrum. At least one of a polishing endpoint or an adjustment for a polishing rate is determined based on at least one normalized predetermined spectrum from the sequence of normalized spectra.

In another aspect, a method for fabricating a substrate includes depositing at least one dielectric layer on a metallic layer or semiconductor wafer of the substrate. A base spectrum reflected from the substrate is measured by an optical metrology system, after depositing the at least one dielectric layer but before depositing an outermost layer. The outermost layer is deposited on the at least one dielectric layer, the outermost layer of the substrate is polished, and during polishing of the outermost layer a sequence of raw spectra reflected from the substrate is measured by an in-situ optical monitoring system. Each raw spectrum in the sequence of raw spectra is normalized to generate a sequence of normalized spectra using the raw spectrum and the post deposition base spectrum, and at least one of a polishing endpoint or an adjustment for a polishing rate is determined based on at least one normalized predetermined spectrum from the sequence of normalized spectra.

In another aspect, an integrated circuit fabrication system includes a deposition system, a metrology system and a polishing system. The deposition system is configured to receive a substrate, and deposit a stack of layers overlying a metallic layer or semiconductor substrate, the stack of layers including a non-metallic layer to undergo polishing and at least one dielectric layer underlying the non-metallic layer. The metrology system configured to generate a measurement of a spectrum of light reflected from the substrate after deposition of the at least one dielectric layer and before deposition of the non-metallic layer. The polishing system is configured to receive the substrate and polish the non-metallic layer on the substrate, and includes a controller configured to perform operations including: receiving the measurement of the spectrum of light from the metrology system and store the measurement as a base spectrum, receiving measurements of a sequence of raw spectra of light reflected from the substrate during polishing with an in-situ optical monitoring system, normalizing each raw spectrum in the sequence of raw spectra to generate a sequence of normalized spectra using the raw spectrum and the base spectrum, and determining at least one of a polishing endpoint or an adjustment for a polishing rate based on at least one normalized predetermined spectrum from the sequence of normalized spectra.

In another aspect, a polishing system includes a carrier, a platen, an in-situ optical monitoring system, and a controller. The carrier is configured to mount a substrate, wherein the substrate includes a stack of layers overlying a metallic layer or semiconductor substrate, the stack of layers including a non-metallic layer undergoing polishing and a plurality of deposited dielectric layers underlying the non-metallic layer. The platen receives a polishing pad configured to be in contact with the substrate. The controller is configured to perform operations comprising: storing a post deposition base spectrum, the post deposition base spectrum being a spectrum of light reflected from the substrate after deposition of the plurality of deposited dielectric layers and before deposition of the non-metallic layer; receiving measurements of a sequence of raw spectra of light reflected from the substrate during polishing with an in-situ optical monitoring system; normalizing each raw spectrum in the sequence of raw spectra to generate a sequence of normalized spectra using the raw spectrum and the post deposition base spectrum; and determining at least one of a polishing endpoint or an adjustment for a polishing rate based on at least one normalized predetermined spectrum from the sequence of normalized spectra.

In another aspect, a computer program product, tangibly embodied in a machine readable storage device, includes instructions that when executed by one or more computers cause the one or more computers to perform operations including receiving a base measurement, the base measurement being an eddy current measurement of a substrate after deposition of at least one layer overlying a semiconductor wafer and before deposition of a conductive layer over the at least one layer. After deposition of the conductive layer over the at least one layer and during polishing of the conductive layer on substrate, a sequence of raw measurements of the substrate is received from an in-situ eddy current monitoring system. Each raw measurement in the sequence of raw measurement is normalized to generate a sequence of normalized measurements using the raw measurement and the base measurement, and at least one of a polishing endpoint or an adjustment for a polishing rate is determined based on at least the sequence of normalized measurements.

Implementations may optionally include one or more of the following advantages. The accuracy in determining an endpoint to polishing a substrate can be improved by filtering noise from variations in thicknesses and/or refractive index of deposited underlying layers on substrates. During polishing, the thickness of an outermost material layer undergoing polishing can be tracked by obtaining spectra measurements of the substrate.

BRIEF DESCRIPTION OF THE DRAWINGS

Like reference numbers and designations in the various drawings indicate like elements.

DETAILED DESCRIPTION

A substrate can include a stack of layers overlying a metallic layer or a semiconductor substrate, the stack of layers including a outermost layer undergoing polishing and a plurality of deposited layers underlying the outermost layer. In some implementations, the outermost layer is a non-metallic layer. As an example, reference is made throughout to a substrate having alternating layers of dielectric materials, e.g., a 3D NAND structure. It should be understood that other substrates can be used, and that the substrate described in FIG. 1 is one example.

Figure 1A:
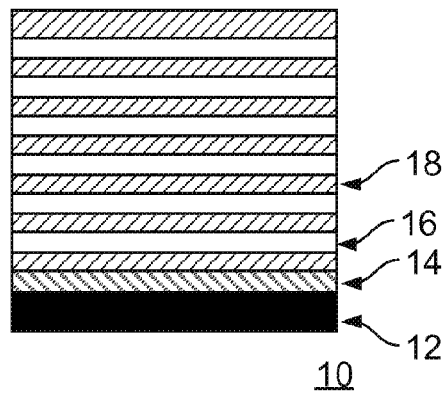
FIGS. 1A-1E are schematic cross-sectional views of an example substrate before, during and after polishing.

As an example, referring to a substrate 10 in FIG. 1A, a substrate base 12, e.g., a glass sheet or semiconductor wafer optionally includes an intermediate layer structure 14, which can include one or more patterned or non-patterned metal, oxide, nitride or polysilicon layers.

At least one additional dielectric layer is deposited between the intermediate layer structure 14 (or the substrate base 12 if the intermediate layer structure is absent) and the outermost layer. In some implementations, the least one additional dielectric layer is a single layer. In some implementations, the at least one dielectric layer includes a plurality of alternating layers deposited over layer structure 14, e.g., over a conductive material. The alternating layers alternate between a first layer material 16 and a second layer material 18. For instance, a first layer 16, e.g., an oxide or nitride, is deposited over the conductive layer 14. A second layer 18, e.g., a nitride or oxide, is deposited over the first layer. For example, the first dielectric layer can be silicon oxide, and the second dielectric layer can be silicon nitride. The deposition is repeated one or more times to create alternating layers of materials. Additionally, the first layer 16 or the second layer 18 can be polysilicon rather than a dielectric.

Figure 1B:
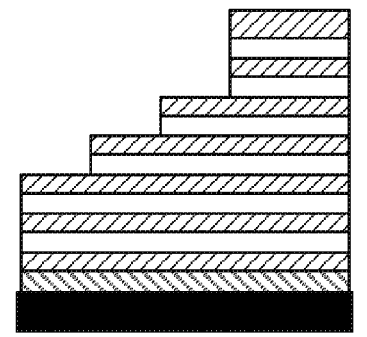

FIG. 1B illustrates the substrate 10 after an etching process has been performed. The substrate 10 has been etched to create a staircase structure, e.g., the substrate has been patterned and etched according to the pattern. Patterning can include applying a photoresist to the substrate 10, described in FIG. 1A, that defines the structure after etching, e.g., a staircase structure. After etching, if a photoresist was used to pattern the substrate, a plasma ashing process can remove the remaining photoresist on the substrate 10.

Figure 1C:
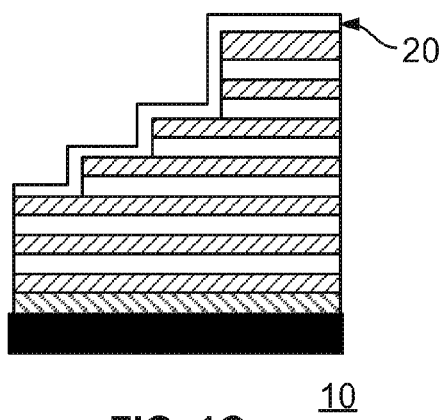

FIG. 1C illustrates the substrate 10 after depositing a layer 20 over the staircase structure. The layer 20 can be a nitride, e.g., silicon nitride. Depending on the substrate 10, the nitride layer 20 can act as an insulator, barrier, or a charge trap in a 3D NAND Flash memory structure.

Figure 1D:
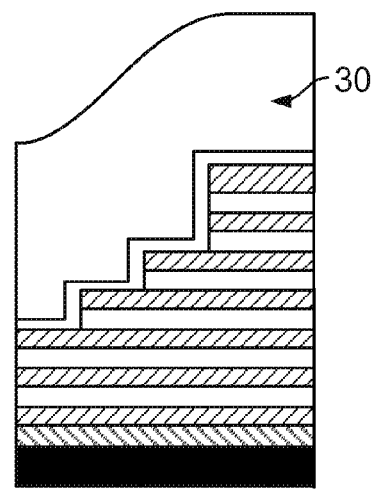
Figure 1E:
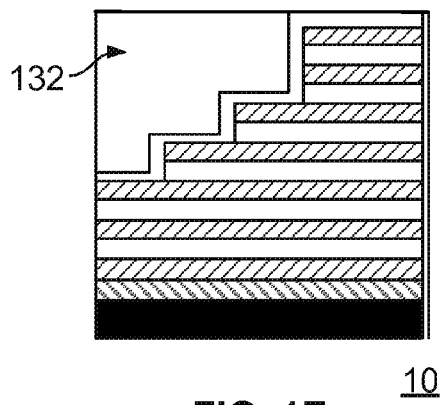

FIG. 1D illustrates the substrate 10 after depositing an outer gap filler layer 30 that is sufficiently thick to fill the recesses, e.g., the recess left by the staircase structure. The outer gap filler layer 30 is a non-metallic layer, e.g., an oxide. For example, the layer 30 can be silicon oxide. FIG. 1E illustrates a substrate 10 after performing a chemical mechanical planarization process. Chemical mechanical polishing can be used to planarize the substrate until the nitride layer 20 is exposed.

Figure 2:
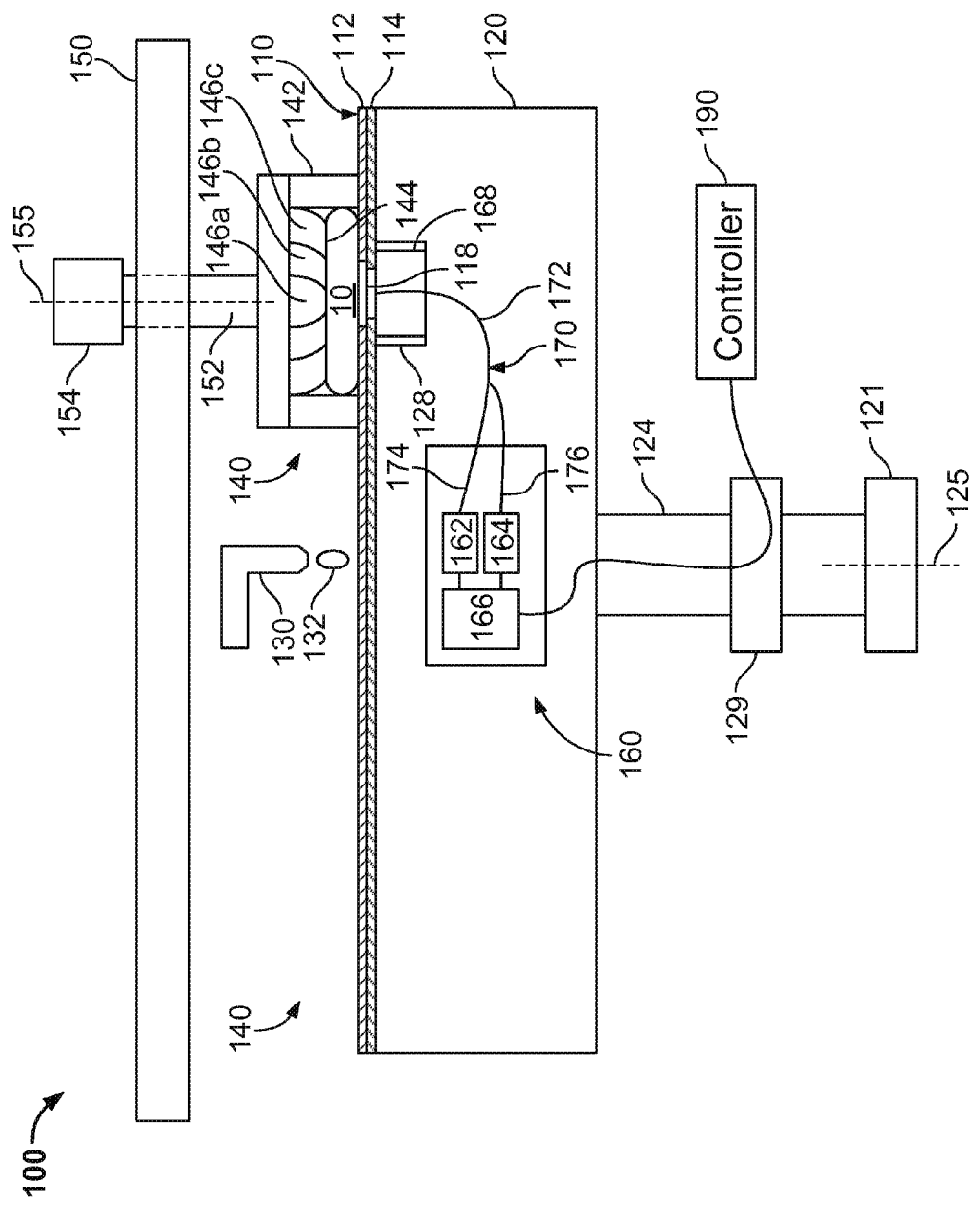
FIG. 2 illustrates a schematic cross-sectional view of an example of a polishing apparatus.

FIG. 2 illustrates an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as a slurry, onto the polishing pad 110 to the pad. The polishing apparatus can also include a polishing pad conditioner to abrade the polishing pad 110 to maintain the polishing pad 110 in a consistent abrasive state.

The polishing apparatus 100 includes one or more carrier heads 140. Each carrier head 140 is operable to hold a substrate 10 against the polishing pad 110. Each carrier head 140 can have independent control of the polishing parameters, for example pressure, associated with each respective substrate.

Figure 3:
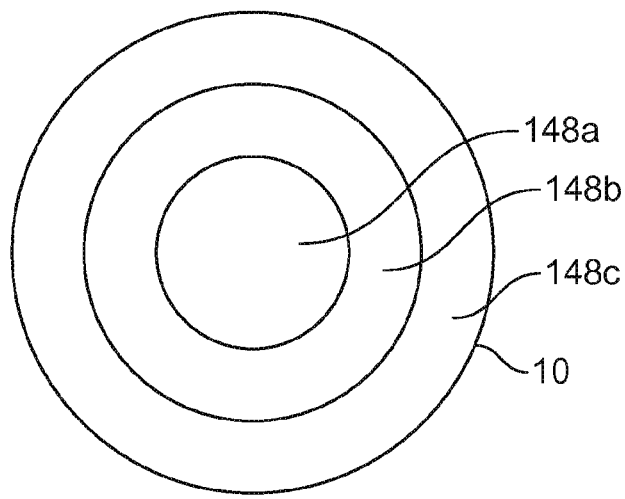
FIG. 3 illustrates a schematic top view of a substrate having multiple zones.

In particular, each carrier head 140 can include a retaining ring 142 to retain the substrate 10 below a flexible membrane 144. Each carrier head 140 also includes multiple independently controllable pressurizable chambers defined by the membrane, e.g., three chambers 146a-146c, which can apply independently controllable pressurizes to associated zones 148a-148c on the flexible membrane 144 and thus on the substrate 10 (see FIG. 3). Referring to FIG. 3, the center zone 148a can be substantially circular, and the remaining zones 148b-148c can be concentric annular zones around the center zone 148a. Although only three chambers are illustrated in FIGS. 2 and 3 for ease of illustration, there could be one or two chambers, or four or more chambers, e.g., five chambers.

Returning to FIG. 2, each carrier head 140 is suspended from a support structure 150, e.g., a carousel or track, and is connected by a drive shaft 152 to a carrier head rotation motor 154 so that the carrier head can rotate about an axis 155. Optionally each carrier head 140 can oscillate laterally, e.g., on sliders on the carousel 150; by rotational oscillation of the carousel itself, or by translation along the track. In operation, the platen is rotated about its central axis 125, and each carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

The polishing apparatus can also include an in-situ optical monitoring system 160, e.g., a spectrographic monitoring system, which can be used for endpoint detection or to determine whether to adjust a polishing rate or an adjustment for the polishing rate as discussed below. An optical access through the polishing pad is provided by including an aperture (i.e., a hole that runs through the pad) or a solid window 118.

The optical monitoring system 160 can include a light source 162, a light detector 164, and circuitry 166 for sending and receiving signals between a controller 190, e.g., a computer, and the light source 162 and light detector 164. One or more optical fibers, e.g., a bifurcated optical fiber 170, can be used to transmit the light from the light source 162 to the optical access in the polishing pad, and to transmit light reflected from the substrate 10 to the detector 164.

The output of the circuitry 166 can be a digital electronic signal that passes through a rotary coupler 129, e.g., a slip ring, in the drive shaft 124 to the controller 190 for the optical monitoring system. Similarly, the light source can be turned on or off in response to control commands in digital electronic signals that pass from the controller 190 through the rotary coupler 129 to the optical monitoring system 160. Alternatively, the circuitry 166 could communicate with the controller 190 by a wireless signal.

The light source 162 can be operable to emit white light. In one implementation, the white light emitted includes light having wavelengths of 200-800 nanometers. A suitable light source is a xenon lamp or a xenon mercury lamp. In some other implementations the emitted light includes light having wavelengths in the near infrared spectrum, e.g., 800-1400 nanometers.

The light detector 164 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency).

As noted above, the light source 162 and light detector 164 can be connected to a computing device, e.g., the controller 190, operable to control their operation and receive their signals. The computing device can include a microprocessor situated near the polishing apparatus, e.g., a programmable computer. With respect to control, the computing device can, for example, synchronize activation of the light source with the rotation of the platen 120.

In some implementations, the light source 162 and detector 164 of the in-situ monitoring system 160 are installed in and rotate with the platen 120. In this case, the motion of the platen will cause the sensor to scan across each substrate. In particular, as the platen 120 rotates, the controller 190 can cause the light source 162 to emit a series of flashes starting just before and ending just after the optical access passes below the substrate 10. Alternatively, the computing device can cause the light source 162 to emit light continuously starting just before and ending just after each substrate 10 passes over the optical access. In either case, the signal from the detector can be integrated over a sampling period to generate spectra measurements at a sampling frequency.

In operation, the controller 190 can receive, for example, a signal that carries information describing a spectrum of the light received by the light detector for a particular flash of the light source or time frame of the detector. Thus, this spectrum is a spectrum measured in-situ during polishing.

Figure 4:
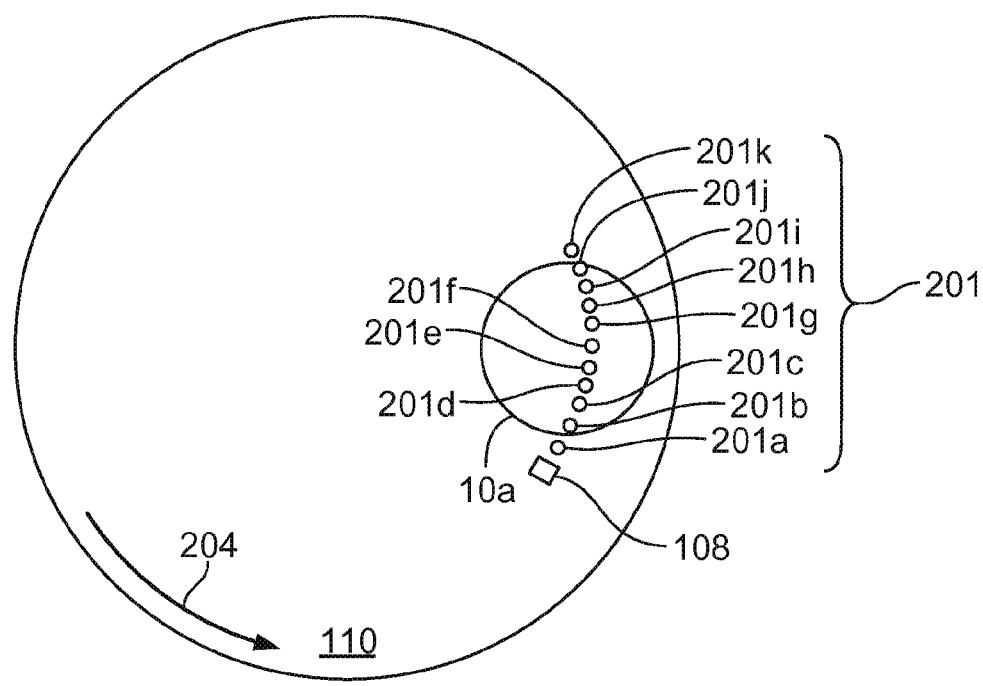
FIG. 4 illustrates a top view of a polishing pad and shows locations where in-situ measurements are taken on a substrate.

As shown by in FIG. 4, if the detector is installed in the platen, due to the rotation of the platen (shown by arrow 204), as the window 108 travels below a carrier head, the optical monitoring system making spectra measurements at a sampling frequency will cause the spectra measurements to be taken at locations 201 in an arc that traverses the substrate 10. For example, each of points 201a-201k represents a location of a spectrum measurement by the monitoring system (the number of points is illustrative; more or fewer measurements can be taken than illustrated, depending on the sampling frequency). The sampling frequency can be selected so that between five and twenty spectra are collected per sweep of the window 108. For example, the sampling period can be between 3 and 100 milliseconds.

As shown, over one rotation of the platen, spectra are obtained from different radii on the substrate 10. That is, some spectra are obtained from locations closer to the center of the substrate 10 and some are closer to the edge. Thus, for any given scan of the optical monitoring system across a substrate, based on timing, motor encoder information, and optical detection of the edge of the substrate and/or retaining ring, the controller 190 can calculate the radial position (relative to the center of the substrate being scanned) for each measured spectrum from the scan. The polishing system can also include a rotary position sensor, e.g., a flange attached to an edge of the platen that will pass through a stationary optical interrupter, to provide additional data for determination of which substrate and the position on the substrate of the measured spectrum. The controller can thus associate the various measured spectra with the controllable zones 148*b*-148*e* (see FIG. 2) on the substrates 10*a* and 10*b*. In some implementations, the time of measurement of the spectrum can be used as a substitute for the exact calculation of the radial position.

Over multiple rotations of the platen, for each zone, a sequence of spectra can be obtained over time. Without being limited to any particular theory, the spectrum of light reflected from the substrate 10 evolves as polishing progresses (e.g., over multiple rotations of the platen, not during a single sweep across the substrate) due to changes in the thickness of the outermost layer, thus yielding a sequence of time-varying spectra. Moreover, particular spectra are exhibited by particular thicknesses of the layer stack.

In some implementations, the controller, e.g., the computing device, can be programmed to receive a measured post deposition base spectrum of the substrate 10, measured after deposition but before polishing, and normalize a sequence of measured spectra from each zone. The controller can then be programmed to compare each normalized spectrum from the sequence of normalized measured spectra from each zone to multiple reference spectra to generate a sequence of best matching reference spectra for each zone.

As used herein, a reference spectrum is a predefined spectrum generated prior to polishing of the substrate. A reference spectrum can have a pre-defined association, i.e., defined prior to the polishing operation, with a value representing a time in the polishing process at which the spectrum is expected to appear, assuming that the actual polishing rate follows an expected polishing rate. Alternatively or in addition, the reference spectrum can have a pre-defined association with a value of a substrate property, such as a thickness of the outermost layer, e.g., the layer to be polished.

A reference spectrum can be generated empirically, e.g., by measuring the spectra from a test substrate, e.g., a test substrate that includes deposited layers of known layer thicknesses. For example, to generate a plurality of reference spectra, a set-up substrate is polished using the same polishing parameters that would be used during polishing of device wafers while a sequence of spectra are collected. For each spectrum, a value is recorded representing the time in the polishing process at which the spectrum was collected. For example, the value can be an elapsed time, or a number of platen rotations.

In addition to being determined empirically, some or all of the reference spectra can be calculated from theory, e.g., using an optical model of the substrate layers. For example, an optical model can be used to calculate a reference spectrum for a given substrate that includes deposited layers of known thicknesses, and a given outer layer thickness D. A value representing the time in the polishing process at which the reference spectrum would be collected can be calculated, e.g., by assuming that the outer layer is removed at a uniform polishing rate.

A measured spectrum of a substrate undergoing polishing can be compared to reference spectra from one or more libraries.

In some implementations, each reference spectrum is assigned an index value. In general, each library can include many reference spectra 320, e.g., one or more, e.g., exactly one, reference spectra for each platen rotation over the expected polishing time of the substrate. This index can be the value, e.g., a number, representing the time in the polishing process at which the reference spectrum is expected to be observed. The spectra can be indexed so that each spectrum in a particular library has a unique index value. The indexing can be implemented so that the index values are sequenced in an order in which the spectra of a test substrate were measured. An index value can be selected to change monotonically, e.g., increase or decrease, as polishing progresses. In particular, the index values of the reference spectra can be selected so that they form a linear function of time or number of platen rotations (assuming that the polishing rate follows that of the model or test substrate used to generate the reference spectra in the library). For example, the index value can be proportional, e.g., equal, to a number of platen rotations at which the reference spectra was measured for the test substrate or would appear in the optical model. Thus, each index value can be a whole number. The index number can represent the expected platen rotation at which the associated spectrum would appear.

The reference spectra and their associated index values can be stored in a library of reference spectra. For example, each reference spectrum and its associated index value can be stored in a record of database. The database of reference libraries of reference spectra can be implemented in the memory of the computing device of the polishing apparatus.

As noted above, for each zone of each substrate, based on the sequence of measured spectra or that zone and substrate, the controller 190 can be programmed to generate a sequence of best matching spectra. A best matching reference spectrum can be determined by comparing a measured spectrum obtained during polishing to the reference spectra from a particular library.

The measured raw spectra are normalized using a post deposition base spectrum measured from the substrate. Obtaining a post deposition base spectrum is described below, with reference to FIG. 5. The base spectrum can be obtained before polishing the substrate. In particular, the base spectrum can be measured after deposition of one or more dielectric layers onto the substrate, but before deposition of the layer to be polished. The base spectrum can be measured after deposition of an entire stack of alternating oxide and nitride layers. For example, the stack of alternating layers can be an ONON stack (i.e., a stack of alternating oxide and nitride layers) deposited in creation of a 3D NAND memory. In some implementations, the base spectrum is measured prior to etching the substrate, e.g., prior to creating a staircase structure. In some implementations, the base spectrum is measured after etching the substrate, but prior to depositing an intermediate layer, e.g., a nitride layer. In some implementations, the base spectrum is measured after depositing the intermediate layer, but prior to depositing a gap filler layer, e.g., an oxide layer sufficiently thick to fill the etched aperture. After normalizing a raw spectrum, the normalized spectrum is then compared, e.g., by calculating the sum of squared differences, cross-correlation, or the like, to the reference spectra to determine the best match.

The base spectrum can be measured at a stand-alone metrology station, e.g., a system from Nova Measuring Instruments or Nanometrics, or at an in-line metrology station that is integrated into the deposition or etching system responsible for carrying out the deposition or etching processes described with reference to FIG. 5.

Normalizing can include a division operation in which the raw spectrum is in the numerator and the base spectrum is in the denominator. The base spectrum can be a spectrum of light reflected from the multiple dielectric layers and material of the bottommost layer that light would be expected to reach. Measuring the base spectrum is described above, with reference to three process points to measure, e.g., after deposition of the layer stack, after etching, and after deposition of an intermediate layer.

A measured spectrum can be normalized as follows:

$$R=(A-DA)/(B-DB)$$

where R is the normalized spectrum, A is the raw spectrum, DA and DB are dark spectrums obtained under the dark condition, and B is a base spectrum. A dark spectrum is a spectrum measured by the in-situ optical monitoring system when no substrate is being measured by the in-situ optical monitoring system. In some implementations, DA and DB are the same spectrum. In some implementations, DA is a dark spectrum collected when the raw spectrum is collected, e.g., at the same platen rotation, and DB is a dark spectrum collected when raw spectrum is collected, e.g., at the same platen rotation.

Figure 5:
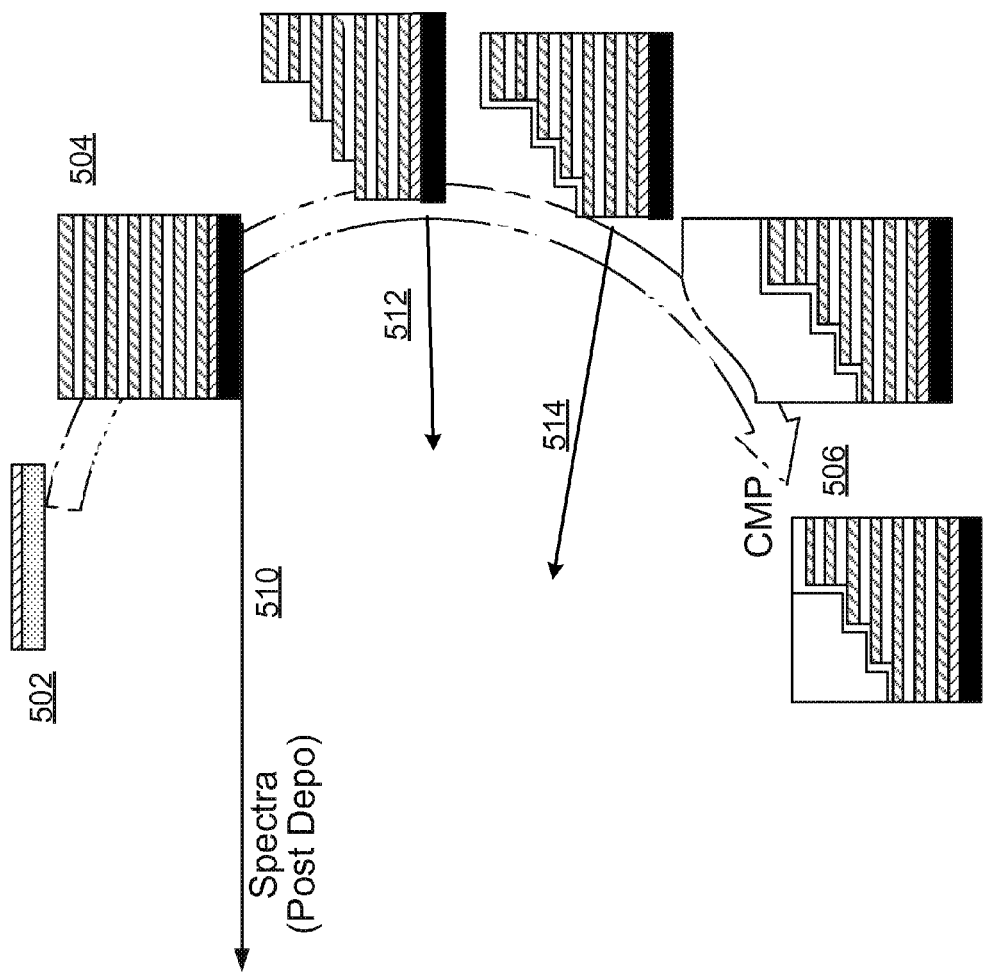
FIG. 5 illustrates different stages of fabrication of an example substrate at which post deposition base spectra can be measured.

FIG. 5 illustrates different stages of fabrication at which post deposition base spectra can be measured. FIG. 5 illustrates an example substrate 502 in different stages of fabrication, from an initial stage 502, to a post deposition stage 504, e.g., the substrate 502 with layers of dielectric materials deposited, and to the final post polishing stage 506. To obtain the post deposition base spectrum, e.g., a spectrum of the substrate at a post deposition stage, i.e., stage 504 and after, the spectrum can be measured by an optical monitoring system. As described above, the post deposition base spectrum can also be obtained from the spectrum of a post etch substrate 512, e.g., the substrate after removing material from one or more layers deposited on the substrate, e.g., material removed from the substrate after deposition 510. Additionally, the post deposition base spectrum can be obtained from the spectrum of a pre gap fill substrate 514, e.g., a substrate that has had a layer of material applied to it after etching 512, e.g., a nitride deposition layer, but before the deposition of a gap fill layer, e.g., a thick oxide.

Figure 6:
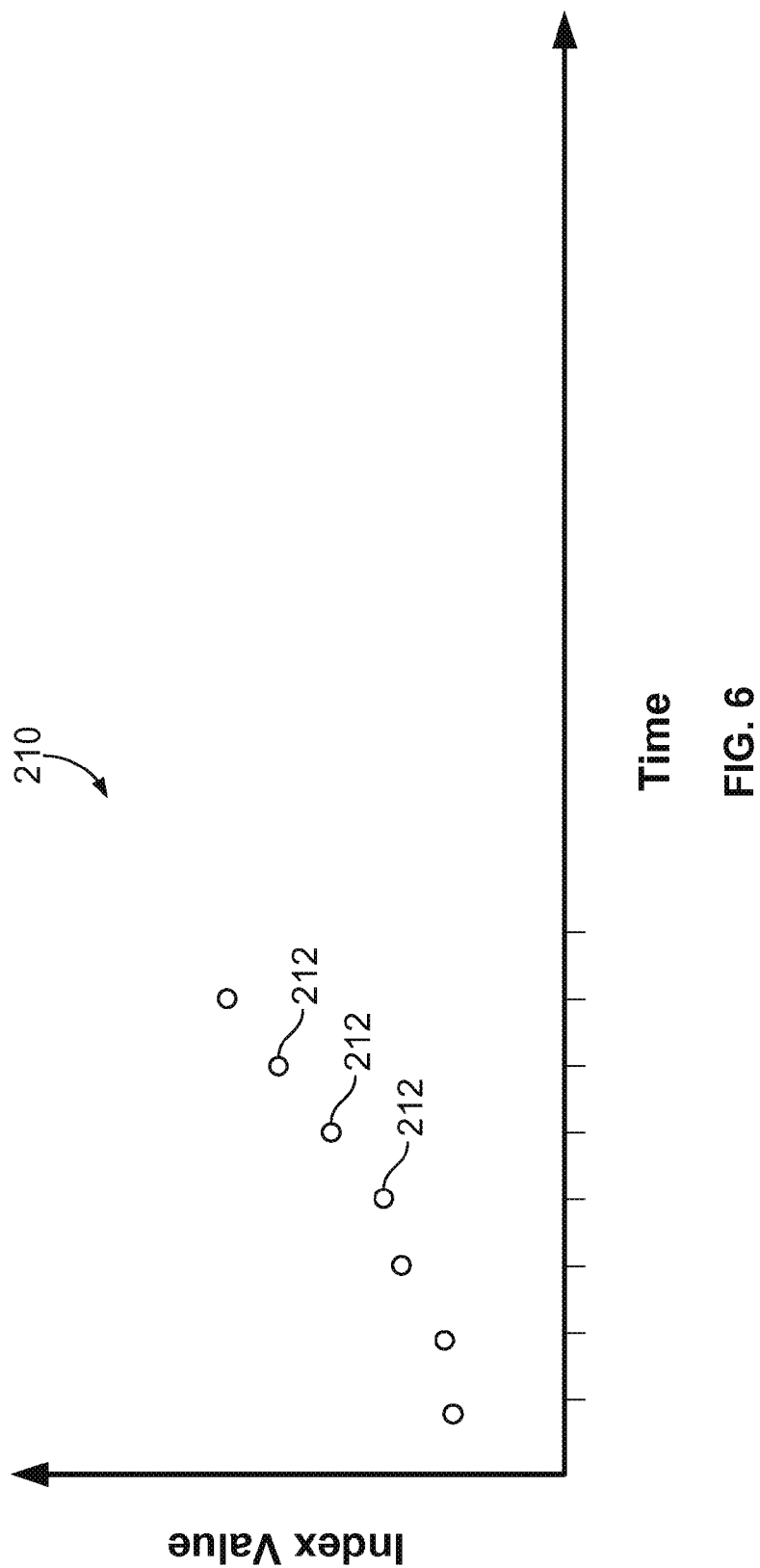
FIG. 6 illustrates a sequence of values generated from the measured spectrum.

Now referring to FIG. 6, which illustrates the results for only a single zone of a single substrate, the index value of each of the best matching spectra in the sequence can be determined to generate a time-varying sequence of index values 212. This sequence of index values can be termed an index trace 210. In some implementations, an index trace is generated by comparing each normalized measured spectrum, e.g., normalized to a measured post deposition base spectrum, to the reference spectra from exactly one library. In general, the index trace 210 can include one, e.g., exactly one, index value per sweep of the optical monitoring system below the substrate.

For a given index trace 210, where there are multiple spectra measured, and normalized, for a particular zone in a single sweep of the optical monitoring system (termed "current spectra"), a best match can be determined between each of the current normalized measured spectra and the reference spectra of one or more, e.g., exactly one, library. In some implementations, each selected current spectra is compared against each reference spectra of the selected library or libraries. Alternatively, in some implementations, the current spectra can be combined, e.g., averaged, and the resulting combined spectrum is compared against the reference spectra to determine the best match, and thus the index value.

In summary, each index trace includes a sequence 210 of index values 212, with each particular index value 212 of the sequence being generated by selecting the index of the reference spectrum from a given library that is the closest fit to the normalized measured spectrum. The time value for each index of the index trace 210 can be the same as the time at which the normalized measured spectrum was measured.

Figure 7:
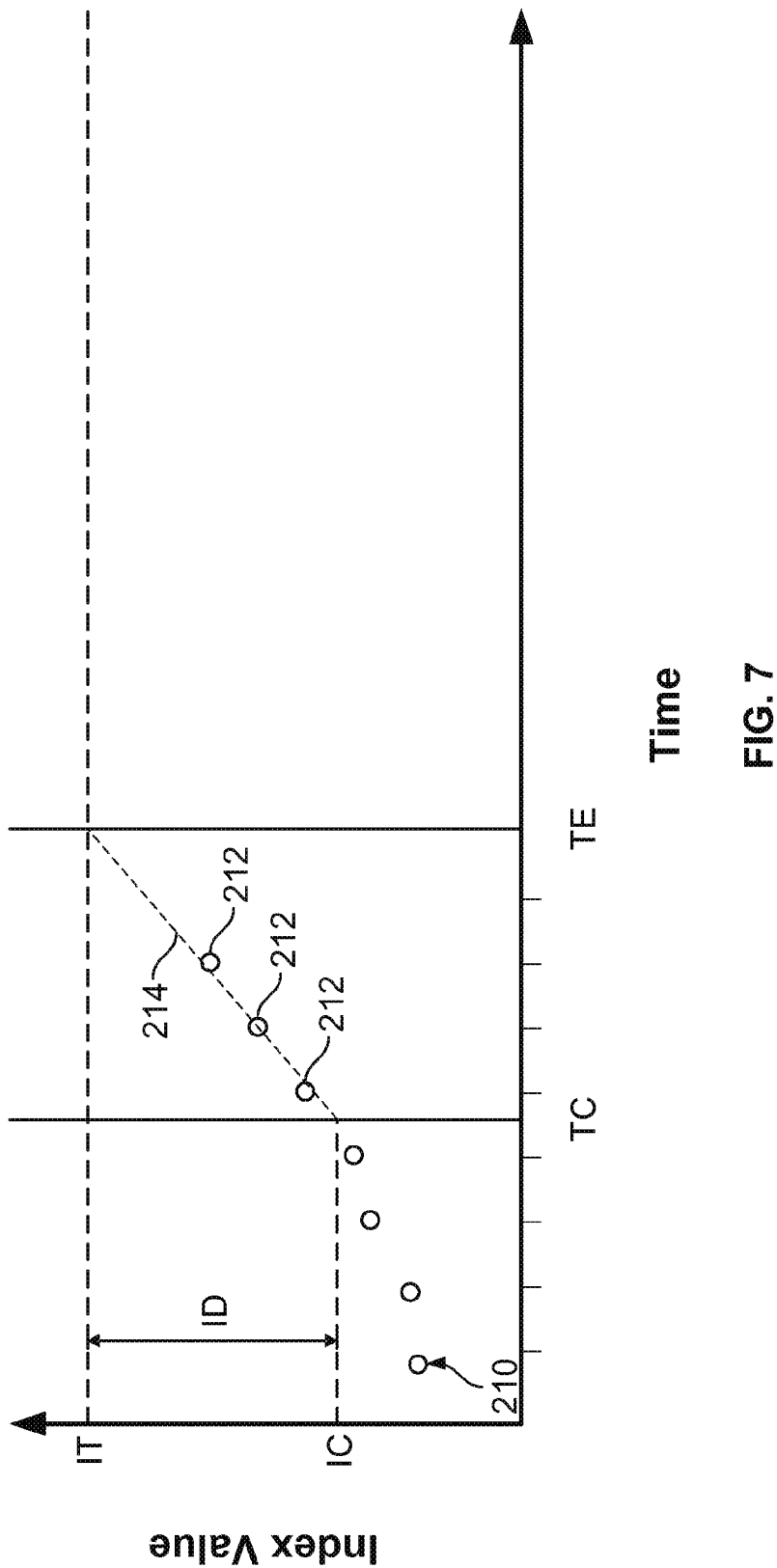
FIG. 7 illustrates a linear function fit to the sequence of values.

As shown in FIG. 7, a function, e.g., a polynomial function of known order, e.g., a first-order function (e.g., a line 214) is fit to the sequence of index values of spectra, e.g., using robust line fitting. Other functions can be used, e.g., polynomial functions of second-order, but a line provides ease of computation. Polishing can be halted at an endpoint time TE that the line 214 crosses a target index IT.

Figure 8:
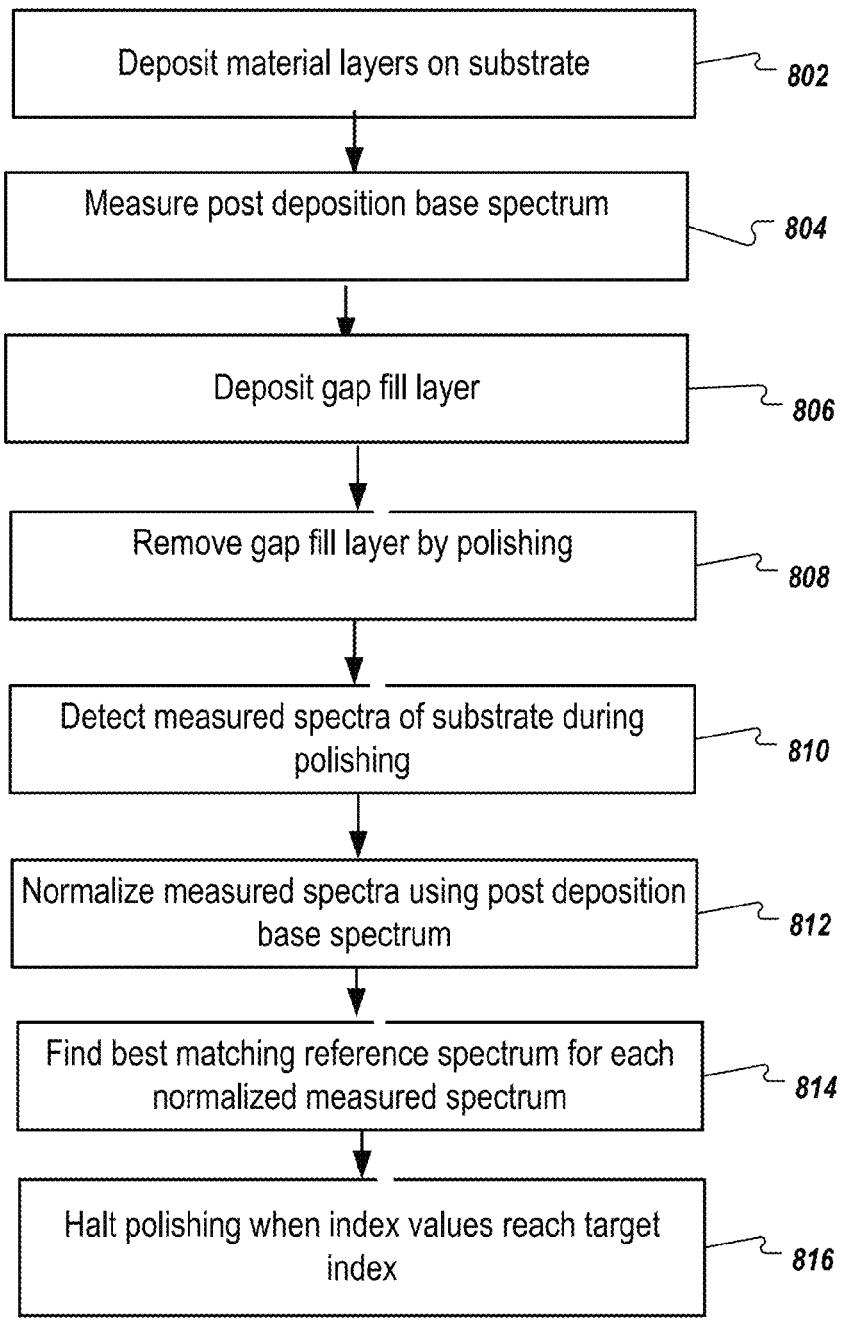
FIG. 8 is a flow diagram of an example process for fabricating a substrate and detecting a polishing endpoint.

FIG. 8 shows a flow chart of a method of fabricating and polishing a product substrate. The product substrate can have at least the same layer structure and the same pattern, as the test substrates used to generate the reference spectra of the library. In some implementations the method of FIG. 8 can be performed using a fabrication facility, described below with reference to FIG. 9. FIG. 8 illustrates a method of fabricating and polishing an example substrate, e.g., a 3D NAND structure, however it should be understood that steps 804, and steps 808-816, can apply to any suitable fabricated substrate.

Figure 9:
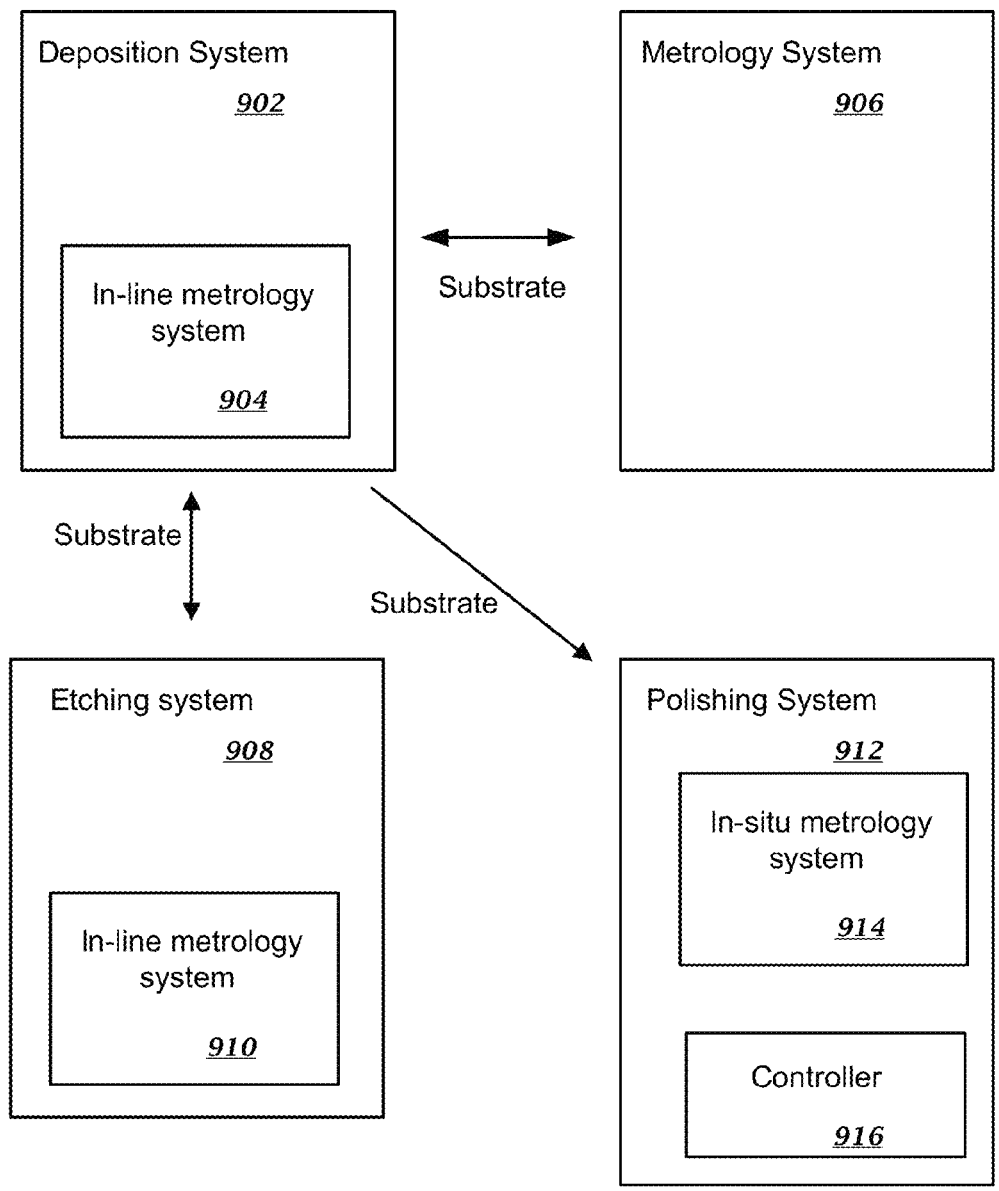
FIG. 9 is a schematic illustration of a fabrication facility.

FIG. 9 is a schematic illustration of a fabrication facility 900. The fabrication facility 900 includes a deposition system 902, e.g., a chemical vapor deposition system or plasma-enhanced chemical vapor deposition system, that optionally includes an in-line metrology system 904. In some implementations the fabrication facility 900 can include a stand-alone metrology system 906.

The fabrication facility 900 further includes an etching system 908 that can receive a substrate, pattern the substrate, and perform an etching process. The etching system 908 can include an in-line metrology system 910.

Additionally, the fabrication facility 900 includes a polishing system 912 that can receive a substrate and polish, e.g., remove, an outer layer of material on the substrate. The polishing system 912 is configured with an in-situ optical metrology system 914, and a controller 916 configured to perform operations.

Layers of material are deposited on the substrate (step 802). As noted above, with reference to FIGS. 1A, and 5, a substrate base 12, e.g., a glass sheet or semiconductor wafer, can include a conductive layer 14, e.g., a metal, such as copper, tungsten or aluminum disposed over the substrate base.

The substrate is transported to a deposition system 902. In some implementations, alternating layers, e.g., alternating a first layer material and a second layer material, are deposited by the deposition system 902 over the substrate, or in some implementations conductive layer 14. For instance, a first dielectric layer 16, e.g., an oxide or nitride, is deposited over the conductive layer, and a second dielectric layer, e.g., an oxide or nitride, is deposited over the first layer. For example, the first dielectric layer can be silicon oxide, and the second dielectric layer can be silicon nitride. The deposition is repeated one or more times to create a stack of alternating layers of materials. As described above with reference to FIG. 1, one of the layers, e.g., the first layer material or a second layer material, can be polysilicon.

A spectrum reflected off the substrate can be measured at this point in the fabrication process, and stored as a post deposition base spectrum, described in step 804. The substrate can be measured by the in-line metrology system 904 in the deposition system 902, or by the stand-alone metrology system 906.

Next, the substrate is patterned and etched, e.g., to create a staircase structure. To perform the etching, the substrate can be transported to the etching system 908. After removal of any remaining photoresist, a spectrum reflected off the substrate can alternatively be measured at this point in the fabrication process, and stored as a post deposition base spectrum. The substrate can be measured by an in-line metrology system 910 in the etching system 908, or by the stand-alone metrology system 906.

Next an intermediate layer, e.g., a nitride layer 20, as in FIG. 1, such as silicon nitride, is deposited over the alternating layers of material having the etched aperture. Deposition of the intermediate layer can be performed by the same deposition system 902 that deposited the stack of alternating layers, or by a different deposition system. A spectrum reflected off the substrate can alternatively be measured at this point of the fabrication process, before deposition of an outer gap fill layer 30, and stored as a post deposition base spectrum. The substrate can be measured by an in-line metrology system, e.g., the in-line metrology system 904 in the deposition system 902, or by the stand-alone metrology system 906.

As a result, the product substrate is measured after deposition but before polishing and before deposition of the layer to be polished (step 804). A spectrum reflected from the product substrate is measured to use in normalizing measured spectra during polishing, as described below. The product substrate is measured to obtain a post deposition base spectrum, e.g., a spectrum of the substrate at a post deposition stage used to normalize raw spectra measured during polishing. The post deposition base spectrum can be measured from the spectrum of the product substrate after deposition and prior to etching. The post deposition base spectrum can also be measured after etching, e.g., after removing material from one or more layers deposited on the product substrate to create a staircase structure. Additionally, the post deposition base spectrum can be measured from after etching and deposition of a nitride layer on the product substrate, but prior to polishing.

An outer gap fill layer, e.g., a thick oxide is deposited onto the substrate after measuring the post deposition base spectrum step 806). Deposition of the intermediate layer can be performed by the same deposition system 902 that deposited the stack of alternating layers and/or by the same deposition system 902 that deposited the intermediate layer, or by a different deposition system.

The product substrate is polished to remove the gap fill layer (step 808). For example, the gap fill layer can be polished and removed at a polishing system 912, e.g., the polishing apparatus described in FIG. 2, using a polishing pad. Of course, steps 802-806 can be performed elsewhere, so that the process for a particular operator of the polishing system 912 begins with step 808.

An in-situ metrology system 914 is used to detect measured spectra of the product substrate during polishing, using the in-situ monitoring system 914 described above (step 810).

The controller 916 in the polishing system 912 normalizes the measured spectra using the measured post deposition base spectrum (step 812), as discussed above. In some implementations, a function, e.g., a linear function is fit to the sequence of index values for the spectra collected after the time TC at which clearance of the gap fill layer is detected.

The normalized measured spectra are analyzed to generate a sequence of index values, and a function is fit to the sequence of index values. In particular, for each measured spectrum in the sequence of measured spectra, the index value for the reference spectrum that is the best fit is determined to generate the sequence of index values (step 814). That is, the measured normalized spectra are analyzed to generate a sequence of index values, and a function is fit to the sequence of index values.

Polishing can be halted once the index value (e.g., a calculated index value generated from the linear function fit to the new sequence of index values) reaches a target index (step 816). A target thickness IT can be set by the user prior to the polishing operation and stored. Alternatively, a target amount to remove can be set by the user, and a target index IT can be calculated from the target amount to remove.

It is also possible to use the function fit to the index values from spectra collected after clearance of the outermost layer, e.g., gap fill layer, is detected to adjust the polishing parameters, e.g., to adjust the polishing rate of one or more zones on a substrate to improve polishing uniformity.

In some implementations, an index trace can be generated for each zone. In addition or alternatively to being used to detect the polishing endpoint, the index traces can be used to calculate an adjustment for a polishing parameter that will adjust a polishing rate for one or more of the zones to improve polishing uniformity, e.g., as described in U.S. patent application Ser. No. 13/094,677, so that the different zones reach their target thickness closer to the same as to reduce the polishing.

Although the discussion above assumes a rotating platen with an optical endpoint monitor installed in the platen, system could be applicable to other types of relative motion between the monitoring system and the substrate. For example, in some implementations, e.g., orbital motion, the light source traverses different positions on the substrate, but does not cross the edge of the substrate. In such cases, the collected spectra can still be grouped, e.g., spectra can be collected at a certain frequency and spectra collected within a time period can be considered part of a group. The time period should be sufficiently long that five to twenty spectra are collected for each group.

In addition, although the discussion above has focused on normalization of a spectrum measured during polishing of a dielectric layer, the approach would also be applicable for normalization of an eddy current measurement during polishing of a conductive layer. In this case, the outermost layer is a conductive layer, e.g., a metal such as copper. An eddy current monitoring system, e.g., as described in U.S. Patent Publication No. 2012/0276661, replaces the optical monitoring system and is used to monitor the substrate during polishing. A stand-alone or in-line eddy current metrology device is used to generate a base measurement of the substrate after deposition of a conductive layer overlying the semiconductor wafer, but before deposition of the outermost conductive layer. The eddy current measurement can be normalized as follows:

$$R = (A-DA)/(B-DB)$$

where R is the normalized measurement, A is the raw measurement during polishing, DA and DB are measurements made by the in-situ eddy current monitoring system when the sensor is not below the substrate, and B is the base measurement made before deposition of the outer conductive outermost layer.

As used in the instant specification, the term substrate can include, for example, a product substrate (e.g., which includes multiple memory or processor dies), a test substrate, and a gating substrate. The term substrate can include circular disks and rectangular sheets.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network. The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims.

What is claimed is:

1. A computer program product, encoded on one or more non-transitory computer storage media, comprising instructions that when executed by one or more computers cause the one or more computers to perform operations comprising:
    storing a base spectrum, the base spectrum being a spectrum of light reflected from a substrate after deposition of a plurality of deposited dielectric layers overlying a metallic layer or semiconductor wafer and before deposition of a non-metallic layer over the plurality of deposited dielectric layers;
    after deposition of the non-metallic layer over the plurality of deposited dielectric layers and during polishing of the non-metallic layer on the substrate, receiving from an in-situ optical monitoring system measurements of a sequence of raw spectra of light reflected from the substrate during polishing;
    normalizing each raw spectrum in the sequence of raw spectra to generate a sequence of normalized spectra using the raw spectrum and the base spectrum; and
    determining at least one of a polishing endpoint or an adjustment for a polishing rate based on at least one normalized predetermined spectrum from the sequence of normalized spectra.

2. The computer program product of claim 1, wherein the base spectrum comprises a spectrum of the substrate measured after deposition of the dielectric layers but before an etching process, after the etching process but before deposition of a nitride layer, or after deposition of the nitride layer but before depositing the non-metallic layer undergoing polishing.

3. The computer program product of claim 1, wherein normalizing comprises a division operation in which the raw spectrum is in a numerator and the base spectrum is in a denominator.

4. The computer program product of claim 3, wherein the division operation comprises calculating $$R = \frac{A - D_A}{B - D_B}$$

where R is the normalized spectrum, A is the raw spectrum, B is the base spectrum and $D_A$ and $D_B$ are dark spectra, the one or more dark spectra being measured by the in-situ optical monitoring system when no substrate is being measured by the in-situ optical monitoring system.

5. The computer program product of claim 1, wherein the operations further comprise generating a sequence of values from the sequence of normalized spectra, fitting a function to the sequence of values, determining a projected time at which the function reaches a target value, and determining at least one of the polishing endpoint or the adjustment for the polishing rate based on the projected time.

6. The computer program product of claim 5, wherein the operations further comprise:
    for each normalized spectrum from the sequence of normalized spectra, finding a best matching reference spectrum from a library having a plurality of reference spectra, and wherein generating the sequence of values includes determining a value associated with each best matching reference spectrum.

7. The computer program product of claim 6, wherein the operations further comprise halting the polishing when the function matches or exceeds the target value.

8. The computer program product of claim 1, wherein polishing the substrate comprises a back-end-of-line portion of an integrated circuit fabrication process.

9. A method of fabricating a substrate comprising:
depositing at least one dielectric layer on a metallic layer or semiconductor wafer of the substrate;
measuring a base spectrum reflected from the substrate, at an optical metrology system, after depositing the at least one dielectric layer but before depositing an outermost layer;
depositing the outermost layer on the at least one dielectric layer;
polishing the outermost layer of the substrate;
during polishing of the outermost layer, measuring a sequence of raw spectra reflected from the substrate, at an in-situ optical monitoring system;
normalizing each raw spectrum in the sequence of raw spectra to generate a sequence of normalized spectra using the raw spectrum and the base spectrum; and
determining at least one of a polishing endpoint or an adjustment for a polishing rate based on at least one normalized predetermined spectrum from the sequence of normalized spectra.

10. The method of claim 9, comprising
depositing alternating non-metallic layers onto the substrate, the alternating non-metallic layers including the at least one dielectric layer;
etching the substrate to create a staircase structure;
depositing an intermediate layer onto the etched substrate; and
depositing the outermost layer onto the intermediate layer.

11. The method of claim 10, wherein measuring the base spectrum comprises measuring the base spectrum after depositing the alternating non-metallic layers onto the substrate but before etching the substrate, the alternating non-metallic layers comprising alternating oxide and nitride layers.

12. The method of claim 10, wherein measuring the base spectrum comprises measuring the base spectrum after etching the substrate but before depositing a nitride layer.

13. The method of claim 10, wherein measuring the base spectrum comprises measuring the base spectrum after depositing a nitride layer but before depositing the outermost layer.

14. An integrated circuit fabrication system, comprising:
a deposition system configured to receive a substrate, and deposit a stack of layers overlying a metallic layer or semiconductor substrate, the stack of layers including a non-metallic layer to undergo polishing and at least one dielectric layer underlying the non-metallic layer;
a metrology system configured to generate a measurement of a spectrum of light reflected from the substrate after deposition of the at least one dielectric layer and before deposition of the non-metallic layer; and
a polishing system configured to receive the substrate and polish the non-metallic layer on the substrate, wherein the polishing system includes a controller configured to receive the measurement of the spectrum of light from the metrology system and store the measurement as a base spectrum,
receive measurements of a sequence of raw spectra of light reflected from the substrate during polishing with an in-situ optical monitoring system,
normalize each raw spectrum in the sequence of raw spectra to generate a sequence of normalized spectra using the raw spectrum and the base spectrum, and
determine at least one of a polishing endpoint or an adjustment for a polishing rate based on at least one normalized predetermined spectrum from the sequence of normalized spectra.

15. The system of claim 14, wherein the base spectrum comprises a spectrum of the substrate measured after deposition of the at least one dielectric layer but before an etching process, after the etching process but before deposition of a nitride layer, or after deposition of the nitride layer but before depositing the non-metallic layer undergoing polishing.

16. The system of claim 14, wherein the metrology system is an in-line metrology station in the deposition system.

17. The system of claim 14, wherein the metrology system is a stand-alone metrology system.

18. A polishing system comprising:
a carrier configured to mount a substrate, wherein the substrate includes a stack of layers overlying a metallic layer or semiconductor substrate, the stack of layers including a non-metallic layer undergoing polishing and a plurality of deposited dielectric layers underlying the non-metallic layer;
a platen to receive a polishing pad configured to be in contact with the substrate;
an in-situ optical monitoring system; and
a controller configured to
store a post deposition base spectrum, the post deposition base spectrum being a spectrum of light reflected from the substrate after deposition of the plurality of deposited dielectric layers and before deposition of the non-metallic layer;
receive, from the in-situ optical monitoring system, measurements of a sequence of raw spectra of light reflected from the substrate during polishing;
normalize each raw spectrum in the sequence of raw spectra to generate a sequence of normalized spectra using the raw spectrum and the post deposition base spectrum; and
determine at least one of a polishing endpoint or an adjustment for a polishing rate based on at least one normalized predetermined spectrum from the sequence of normalized spectra.

19. A computer program product, encoded on one or more non-transitory computer storage media, comprising instructions that when executed by one or more computers cause the one or more computers to perform operations comprising:
storing a base measurement, the base measurement being an eddy current measurement of a substrate after deposition of at least one layer overlying a semiconductor wafer and before deposition of a conductive layer over the at least one layer;
after deposition of the conductive layer over the at least one layer and during polishing of the conductive layer on substrate, receiving a sequence of raw measurements of the substrate from an in-situ eddy current monitoring system;
normalizing each raw measurement in the sequence of raw measurement to generate a sequence of normalized measurements using the raw measurement and the base measurement; and determining at least one of a polishing endpoint or an adjustment for a polishing rate based on at least the sequence of normalized measurements.

* * * * *